United States Patent [19]
Zachry et al.

[11] 4,316,605
[45] Feb. 23, 1982

[54] MAGNET MOUNTING TOOL

[75] Inventors: Clyde L. Zachry, Poway; William C. McCutchen, San Diego, both of Calif.

[73] Assignee: Burroughs Corporation, Detroit, Mich.

[21] Appl. No.: 107,168

[22] Filed: Dec. 26, 1979

[51] Int. Cl.³ .......................................... H01F 41/02
[52] U.S. Cl. ...................... 269/43; 29/737; 29/744; 29/760; 269/48.1; 269/254 CS
[58] Field of Search ............... 29/737, 604, 744, 732, 29/760, 607, 598, 596, 239; 269/254 CS, 48.1, 909, 43; 156/293, 297, 423, 559, 580

[56] References Cited

U.S. PATENT DOCUMENTS

| | | | |
|---|---|---|---|
| 2,523,507 | 9/1950 | Langford et al. | 156/581 X |
| 2,691,212 | 10/1954 | Hildebrand | 29/239 |
| 3,818,586 | 6/1974 | Harkness et al. | 29/598 |
| 3,835,522 | 9/1974 | Ward | 29/239 |
| 4,182,027 | 1/1980 | Benezech | 29/598 |

*Primary Examiner*—Carl E. Hall

*Attorney, Agent, or Firm*—Charles J. Fassbender; Kevin R. Peterson

[57] ABSTRACT

A magnetic bubble memory packaging tool comprising a stationary base having a bias magnet replaceable mounting arm which cooperates with a moveable bias magnet replaceable mounting arm on a moveable base, the latter being coupled to move relative to said stationary base by a spring biased screw arrangement. With the bias magnets positioned on opposite sides of the mounting arms and with the yoke positioned to a compass the arms, and the bias magnets, rotation of the screw increases the bias of the spring urging the arms and magnets in a direction away from each other and into engagement with the inside walls of the yoke. The spring bias is a measure of the pressure with which the bias magnets engage the yoke for bonding and the screw is calibrated so as to select the bias of the spring. The mounting arms are replaceable to accommodate bias magnets of different dimensions for different bubble memory packages and also disclosed are positioning tools for precisely locating the bias magnets and yoke on the mounting arms.

6 Claims, 7 Drawing Figures

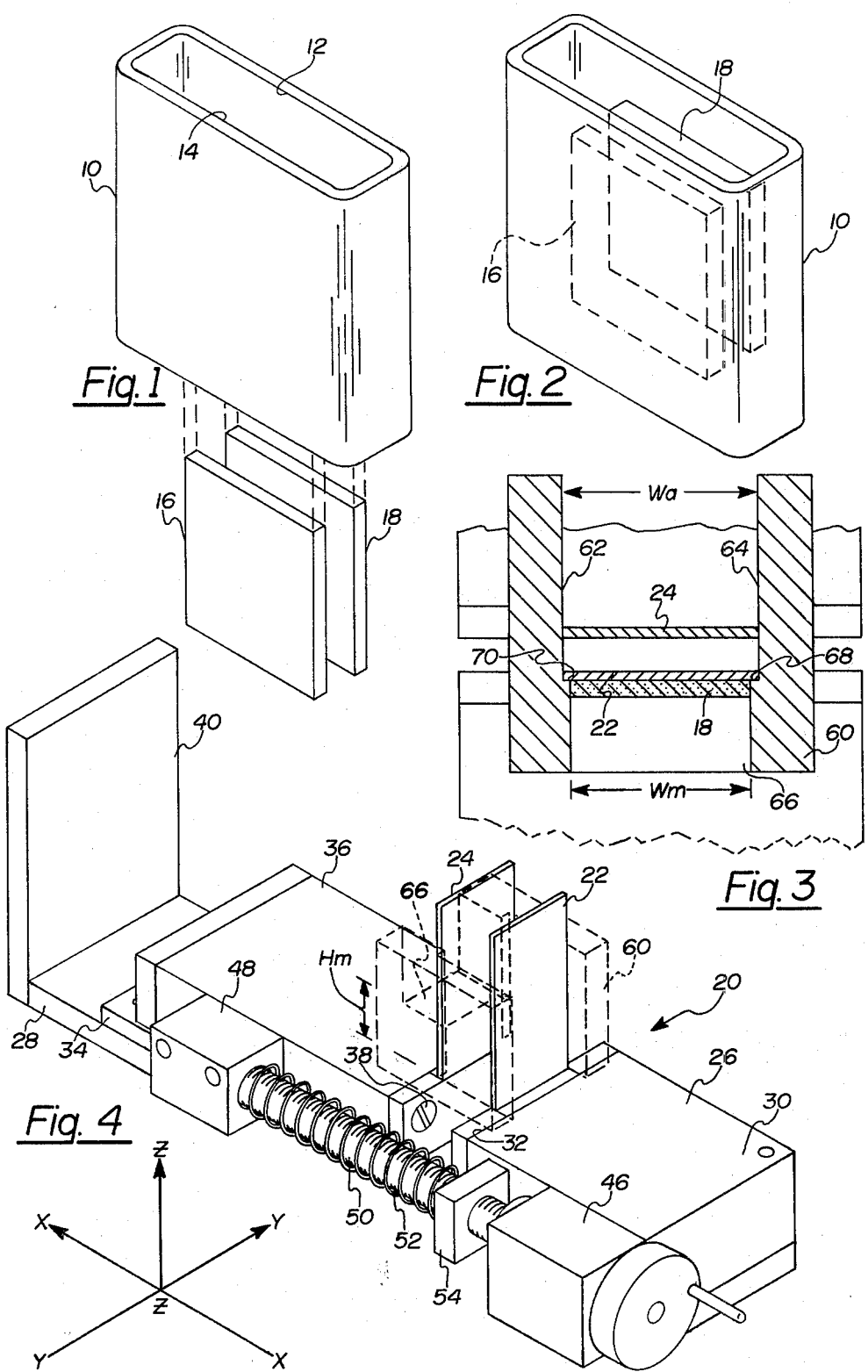

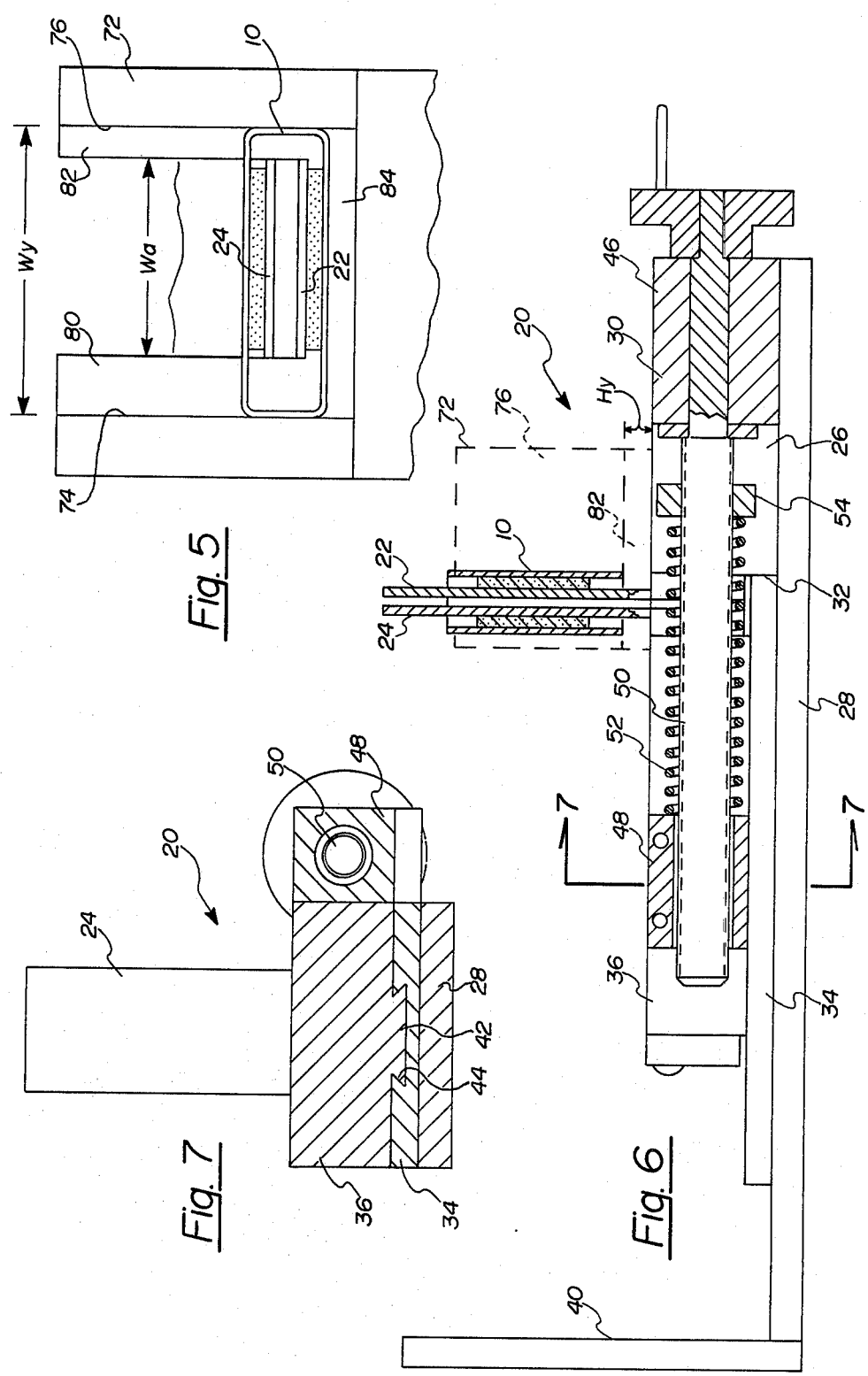

MAGNET MOUNTING TOOL

BACKGROUND OF THE INVENTION

This invention relates to the manufacture of bubble memory packages and in particular to a tool for mounting bias magnets in a yoke during the process of manufacturing bubble memory packages.

The use of bias magnets and yokes in bubble memory packages to provide a bias field to establish and maintain bubbles in a garnet-like ferromagnetic film is, of course, old. The yoke and bias magnets function together with other components including sinusoidal type field drive coils to provide a rotating in-plane magnetic field for bubble movement (propagation) for the storage and management of data represented by the absence or presence of domains under propagate elements all of which also are well known.

In the manufacture of the bubble memory package it is desirable to precisely position and attach the bias magnets to the yoke in order to maintain rather rigid tolerance requirements in the assembly of the package for a number of reasons including the function of the bias magnets and yokes with the other components in the package.

Heretofore, the precise positioning of the magnets relative to the yoke for bonding thereto was difficult. Among other things, the magnets tended to move (slip) as they were being attached to the yoke by a conventional prior art clamping. Further, in the prior art attaching process there has been no means to accommodate different types of adhesives which require different pressures to bond the magnets to the yoke.

Accordingly, it is an object of this invention to provide a simple yet precise tool for mounting bias magnets in a yoke for a bubble memory package.

Still another object of this invention is to provide a tool for mounting bias magnets in a yoke in which an accommodation is made for the different adhesives which may be selected to be used to bond the bias magnets to the yoke.

SUMMARY OF THE INVENTION

The magnetic bubble memory packaging tool which attains the foregoing objects comprises a stationary base having a bias magnet mounting arm which cooperates with a moveable bias magnet mounting arm on a moveable base, the latter being coupled to move relative to said stationary base by a spring biased screw arrangement. With the bias magnets positioned on opposite sides of the mounting arms and with the yoke positioned to a compass the arms, and the bias magnets, rotation of the screw increases the bias of the spring urging the arms and magnets in a direction away from each other and into engagement with the inside walls of the yoke. The spring bias is a measure of the pressure with which the bias magnets engage the yoke for bonding and the screw is calibrated so as to select the bias of the spring. The mounting arms are replaceable to accommodate bias magnets and yokes of different dimensions for different bubble memory packages and positioning tools are used to precisely locate the bias magnets and the yoke on the mounting arms.

BRIEF DESCRIPTION OF THE DRAWINGS

FIG. 1 is an exploded perspective view of the yoke and magnets showing their relationship before the bias magnets are mounted therein, FIG. 2 is a perspective view showing the placement of the bias magnets in the yoke, FIG. 3 is a plan view of the positioning tool for locating the magnets in the yoke, FIG. 4 is a perspective view of the tool forming this invention with the positioning tool of FIG. 3, FIG. 5 is a plan view showing the positioning tool for locating the yoke on the mounting arms, FIG. 6 is a cross-sectional view of the tool, partially broken away, to show the details of the tool and the mounting of the bias magnets in a yoke, and FIG. 7 is a cross-sectional view taken along 7—7 of FIG. 6 to show the coupling of the moveable platform on the stationary base of the tool.

BRIEF DESCRIPTION OF THE PREFERRED EMBODIMENT

Turning now to FIGS. 1 and 2 of the drawings, there is disclosed a closed yoke 10 for use in a magnetic package, which is oval shaped in cross section, formed typically of a ferromagnetic material and with two relatively thin flat walls 12 and 14 with a pair of relatively thin flat rectangular bias magnets 16 and 18 of a suitable permanent magnetic material to be mounted as shown in FIG. 2 on inner sides of the flat walls 12 and 14 of the yoke by a suitable adhesive. While FIG. 1 shows the magnets apart from the yoke and FIG. 2 shows the magnets positioned in the yoke. The yoke and the magnets form no part of this invention other than their cooperation with the tool of this invention.

Turning now to FIGS. 3-7, there is shown a tool comprising this invention and denoted as 20 which includes a pair of upright magnet mounting arms 22 and 24, preferably of a ferromagnetic material, on which the bias magnets 16 and 18 are placed for mounting in the yoke 10 as shown in FIGS. 3 and 6. Mounting arm 24 is moveable relative to the arm 22 in the main axial direction X—X (for the purpose of mounting the magnets in the yoke) as shown in the drawing, as distinguished from the Y—Y and Z—Z directions. Arm 22 is mounted on a stationary base 26 which comprises a relatively thin platform 28 terminating in a relatively thick end portion 30 which forms a ledge 32 against which the arm 22 is replaceably mounted in any suitable manner, as by retaining screws (not shown).

The platform 28 supports a second relatively thin platform 34 on which a moveable base 36 is positioned. This latter base has the second mounting arm 24 replaceably mounted on its end by any suitable manner as by retaining screws 38 and is capable of moving the arm 24 in the X—X axis. An end flange 40 on the end of the platform 28 serves as a stand for supporting the tool upright, if desired. Also, the mounting arms are replaceable to accommodate bias magnets and yokes of different sizes for bubble memory packages of different types and sizes.

In the embodiment illustrated, the moveable base 36 is provided with a tongue 42 (FIG. 7) which extends throughout its longitudinal axis and which cooperates with a suitable axial groove 44 of the same cross section formed in the thin platform 34 so that movement in the X—X direction, only, is assured. Other forms of assuring the X—X direction of movement may be used such as for example, the Table of Microslides Inc. of Westberry, N.Y., model A2031; the tongue and groove being only illustrative of one manner of mounting of the moveable base 36.

Both the moveable base 36 and the stationary base 26 have lugs 46 and 48 extending from their sides and suitably connected thereto and which are centrally apertured to receive a threaded bolt 50. The threaded bolt 50 is rotatably secured against axial movement in the stationary base lug 46 while it is free to slide in the moveable base lug 48. The bolt 50 is also surrounded by a helical spring 52 and a threaded nut 54 is freely rotatable on the bolt and moves in an axial X—X direction upon rotation of the screw by a rotatable crank 58 fixedly secured to one end of the bolt.

Rotation of the crank 58 in one direction causes the threaded nut 54 to move and compress the spring 52 against the second lug 46 which thus tends to move the mounting arm 24 in a direction away from the mounting arm 22. This tendency to move and the resultant compression of the spring, regulates the pressure with which the magnets engage the inner side walls of the yoke. The spring is selected to be linear and calibrated so that a known number of turns, or portions thereof, of the crank 58 determines the amount of pressure equally distributed between the two mounting arms urging the magnets against their respective side walls of the yoke.

In the operation of the tool, the bias magnets 16 and 18 are precisely located on the mounting arms 22 and 24 on the sides facing away from each other and are adhered to the arms by any suitable means such as a two sided adhesive or by taking advantage of the magnetic characteristics of the magnets acting on the ferromagnetic material of the mounting arms. To precisely locate the bias magnets on the mounting arms a positioning tool 60 is used. This tool is in the shape of a cube with inner side walls 62 and 64 spaced apart a distance $W_a$ equalling the width of the mounting arms 22 and 24 by a cross-bar 66. As shown in FIG. 3, the inner walls are also provided with ledges 68 and 70 which decrease the distance between the inner walls to another distance $W_m$ equalling the width of the magnets. Thus, with the cross-bar 66 having a preselected thickness or height $H_m$ (FIG. 4) the magnets are precisely located on the mounting arms. FIG. 3 shows magnet 18 mounted on arm 22 whereas in FIG. 4 the tool 60 is turned around so that the magnet 16 will be located on mounting arm 24. Note that the top surfaces of the stationary base 30 or moveable base 36 are the reference for the height H for locating the magnets on the mounting arms. After positioning the magnets on both mounting arms, the tool 60 is removed. Next, an adhesive is placed on the magnets and then the yoke which is to receive the two bias magnets is precisely positioned, over and relative to the bias magnets also. To position the yoke relative to the magnets and mounting arms a second tool, a yoke mounting tool 72, is used. This tool, like the magnet positioning tool 60, is also in cubic form with a pair of inner walls 74 and 76 spaced apart a distance $W_y$ equalling the width of the yoke. The inner walls 74 and 78 terminate in lower ledges 80 and 82 which are spaced apart a distance $W_a$ which is the same distance $W_a$ as in the tool 60 and is now used to locate tool 72 relative to the mounting arms. A cross-bar 84 connects ledges 80 and 82 and has thickness $H_y$ so that when the tool is positioned on the top surface of one of the bases 30 or 36, the yoke is precisely positioned relative to the magnets. Note as shown in FIG. 5, the magnets are not necessarily located centrally of the yoke. This depends on other requirements of the magnetic packages. With the tool 72 in place, the crank 58 is turned a preselected amount to regulate the compression force of the spring tending to move the two arms apart thus imposing a pressure on the magnets against the yoke. Typically, this pressure can be within 2 or 3 psi depending upon the type of adhesive used for mounting the magnets. Thereafter, with the yoke and magnets in place and under pressure, yoke positioning 72 is removed and the tool 20 is placed in a suitable heat source (furnace) for curing the adhesive and permanently bonding the bias magnets to the yoke. Again, the end flange may be used for supporting the tool upright, if desired, while in the furnace.

In summary, it can be seen that there is disclosed tools for precisely positioning bias magnets in yoke during the manufacture of magnetic bubble memory packages. With the prepositioning of the magnets on the mounting arms and with the precise positioning of the yoke around the arms and magnets, movement by the arms and magnets in the X—X direction enables the magnets to be mounted on the inside walls of the yoke without movement in the Y—Y or Z—Z directions.

What is claimed is:

1. A tool for mounting bias magnets in a yoke in the manufacture of magnetic bubble memories comprising:
    a stationary base with a first upright magnet mounting arm thereon,
    a moveable base coupled to said stationary base and having a second magnetic upright mounting arm thereon in parallel relationship with said first arm,
    both of said arms including surfaces facing away from each other and being adapted to have bias magnets mounted thereon,
    a spring means for separating said arms so as to move said bias magnets away from each other and into engagement with said yoke when said yoke is positioned over both said arms and magnets,
    said stationary base and said moveable base also being provided with supporting means for supporting a threaded bolt, and
    means responsive to rotation of said bolt for varying the force with which said spring presses said magnets against said yoke.

2. The tool as claimed in claim 1, wherein said threaded bolt and said spring are calibrated to define the force with which said spring moves said mounting arms away from each other.

3. The tool as claimed in claim 1, wherein said mounting arms are ferromagnetic.

4. The tool as claimed in claim 1 further including a stand for supporting said tool during further steps in the manufacture of said magnetic bubble memory package.

5. The tool as claimed in claim 1 further including means for aligning said bias magnets on said mounting arm.

6. The tool as claimed in claim 1 further including means for aligning said yoke on said mounting arms and relative to said bias magnets.

* * * * *